(12) United States Patent
Park et al.

(10) Patent No.: US 7,027,308 B2
(45) Date of Patent: Apr. 11, 2006

(54) PRINTED CIRCUIT BOARD METHOD AND APPARATUS

(75) Inventors: Jin-Kwon Park, Kwangmyeong (KR); Chan-youn Won, Suwon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/444,989

(22) Filed: May 27, 2003

(65) Prior Publication Data

US 2004/0070958 A1    Apr. 15, 2004

(30) Foreign Application Priority Data

Oct. 15, 2002    (KR) .................... 10-2002-0062904

(51) Int. Cl.
H05K 7/02    (2006.01)
H05K 7/06    (2006.01)
H05K 7/08    (2006.01)
H05K 7/10    (2006.01)

(52) U.S. Cl. .................. 361/782; 361/785; 361/788; 361/803; 439/620

(58) Field of Classification Search ............ 361/788, 361/785, 782, 789, 803; 710/301, 306; 439/620, 439/61, 62
See application file for complete search history.

(56) References Cited

U.S. PATENT DOCUMENTS

| | | | | |
|---|---|---|---|---|
| 3,988,639 A | * | 10/1976 | Preiser et al. ................ 361/58 |
| 4,659,155 A | * | 4/1987 | Walkup et al. .............. 439/108 |
| 4,725,775 A | * | 2/1988 | McMinn ..................... 324/765 |
| 4,772,225 A | * | 9/1988 | Ulery .......................... 439/620 |
| 4,883,428 A | * | 11/1989 | Tonooka ....................... 439/69 |
| 4,956,604 A | * | 9/1990 | Cedrone ..................... 324/754 |
| 5,057,041 A | * | 10/1991 | Yu et al. ..................... 439/620 |
| 5,151,054 A | * | 9/1992 | Briones et al. ............. 439/620 |
| 5,237,293 A | * | 8/1993 | Kan et al. .................. 333/22 R |
| 5,259,768 A | | 11/1993 | Brunker et al. |
| 5,340,334 A | * | 8/1994 | Nguyen ...................... 439/620 |
| 5,360,353 A | * | 11/1994 | Kinoshita ................... 439/620 |
| 5,453,019 A | * | 9/1995 | Garver et al. ............... 439/188 |
| 5,730,612 A | * | 3/1998 | Tatsuzuki ................... 439/188 |
| 5,734,208 A | * | 3/1998 | Jones ......................... 307/139 |
| 5,839,910 A | * | 11/1998 | Meller et al. .............. 439/188 |
| 5,967,802 A | * | 10/1999 | Daly et al. ................. 439/76.1 |
| 6,334,160 B1 | | 12/2001 | Emmert et al. |
| 6,344,427 B1 | * | 2/2002 | Komatsu et al. ............ 501/138 |
| 6,415,342 B1 | | 7/2002 | Wahl et al. |

FOREIGN PATENT DOCUMENTS

| | | |
|---|---|---|
| JP | 2-112184 | 4/1990 |
| JP | 6-318484 | 11/1994 |
| JP | 9-82420 | 3/1997 |
| KR | 2000-442 | 1/2000 |
| KR | 2002-14413 | 2/2002 |

OTHER PUBLICATIONS

Office Action issued by Taiwan Intellectual Property Office (TIPO) on Sept. 12, 2005 with English translation.

* cited by examiner

*Primary Examiner*—Amir Zarabian
*Assistant Examiner*—Thanh Y. Tran
(74) *Attorney, Agent, or Firm*—Staas & Halsey LLP

(57) ABSTRACT

A PCB having a card slot receiving a card provided with signal input/output pins and a circuit element to provide extended capability is inserted, and having data transmission pins, a power pin and a ground pin in correspondence to the signal input/output pins, comprises an electronic device internally provided for impedance matching with the card, and having a first end connected to one of the data transmission pins and a second end connected to one of the power pin and the ground pin. With this configuration, a card slot internally comprises an electronic device for impedance matching, so that a space of the PCB can be efficiently utilized.

12 Claims, 8 Drawing Sheets

PRINTED CIRCUIT BOARD METHOD AND APPARATUS

CROSS-REFERENCE TO RELATED APPLICATIONS

This application claims the benefit of Korean Patent Application No. 2002-62904, filed Oct. 15, 2002, in the Korean Intellectual Property Office, the disclosure of which is incorporated herein by reference.

BACKGROUND OF THE INVENTION

1. Field of the Invention

The present invention relates to a PCB (printed circuit board), and more particularly, to a PCB having a card slot internally comprising a termination to do impedance matching.

2. Description of the Related Art

Generally, a computer system comprises a main body having a main board to which a plurality of hardware components such as a CPU (central processing unit), a BIOS-ROM (basic input/output system-read only memory) initializing attached devices at the time of booting up the computer system, a RAM (random access memory), a CD-ROM (compact disk-read only memory), a hard disk, etc., are connected.

As shown in FIG. 5, a main board 101 includes card slots 110 to which cards 120 (refer to FIGS. 6A through 6D) such as a memory (RAM) card, a video card, etc. to provide extended capability are inserted, and buses 140 (refer to FIGS. 6A through 6D) through which data signals are transmitted between the card slot 110 and a CPU 130 (refer to FIGS. 6A through 6D). The CPU 130 transmits a high speed digital signal via the buses 140 of the main board 101, and the cards 120 such as the memory (RAM) card, etc., receive the high speed digital signal through the card slots 110 (i.e., as a connecter) connected to the buses 140.

As computer systems use higher speed digital processors, a high frequency (RF) signal employed in the bus also increases. The high frequency signal causes an impedance loss between the card slot 110 and the CPU 130. Thus, to reduce the loss, it is necessary to do impedance matching. The impedance matching is performed by a termination comprising resistors 113 and capacitors 115 which are externally positioned adjacent to the card slots 110 and connected to respective pins of the card slot 110 (see FIG. 5).

As shown in FIGS. 6A through 6D, there are various kinds of terminations, for example, a series connection of the resistor 113 between a power pin (VTT) or ground pin and the respective pin of the card slot 110, a shunt connection of two resistors 113 between the power pin and the respective pin of the card slot 110 and between the ground pin and the respective pin of the card slot 110 a series connection of both the resistor 113 and the capacitor 115 between the ground pin and the respective pin of the card slot 110, etc.

Computer systems can have a small size, thus, reducing component space is advantageous. However, because the conventional termination is fabricated separately from the card slot on the PCB as the main board, the conventional termination occupies a relatively large amount of space on the PCB. Also, a printed circuit is needed to connect the termination and the card slot. Thus, the conventional termination is inconvenient for small computer systems.

SUMMARY OF THE INVENTION

Accordingly, it is an aspect of the present invention to provide a PCB having a card slot comprising an electronic device in the card slot to do impedance matching, thereby decreasing the space occupied by the electronic device on the PCB that does impedance matching, and to simplify a printed circuit of the PCB.

Additional aspects and/or advantages of the invention will be set forth in part in the description which follows and, in part, will be obvious form the description, or may be learned by practice of the invention.

The foregoing and/or other aspects of the present invention are achieved by providing a PCB having a card slot receiving a card provided with signal input/output pins and an internal circuit element, the PCB providing extended capability. Data transmission pins, a power pin, and a ground pin in the card slot correspond to the signal input/output pins on the card. The electronic device inside the card slot provides impedance matching with the card, the electronic device having a first end connected to one of the data transmission pins and a second end connected to either the power pin or the ground pin.

According to an aspect of the invention, the electronic device includes at least one of a chip capacitor and a chip resistor. The chip resistor has a first terminal connected to one of the data transmission pins and a second terminal connected to the power pin or the ground pin. The chip capacitor has a first electrode connected to one of the data transmission pins and a second electrode connected to either the power pin or the ground pin.

In one aspect, the electronic device includes a series connected chip capacitor and chip resistor, the series connection thereof having a first end connected to one of the data transmission pins and a second end connected to either the power pin or the ground pin.

In another aspect, the foregoing also may be achieved by providing a card slot receiving a card provided with signal input/output pins and an internal circuit element, with the card inserted to provide extended capability. The card slot has data transmission pins that include a power pin and a ground pin corresponding to the signal input/output pins on the card. The internal circuit element includes an electronic device to perform impedance matching with the card, the electronic device having a first end connected to one of the data transmission pins and a second end connected to either the power pin or the ground pin.

BRIEF DESCRIPTION OF THE DRAWINGS

These and/or other aspects and advantages of the present invention will become apparent and more readily appreciated from the following description of the embodiments, taken in conjunction with the accompany drawings of which.

DETAILED DESCRIPTION OF THE PREFERRED EMBODIMENTS

Figure 1:
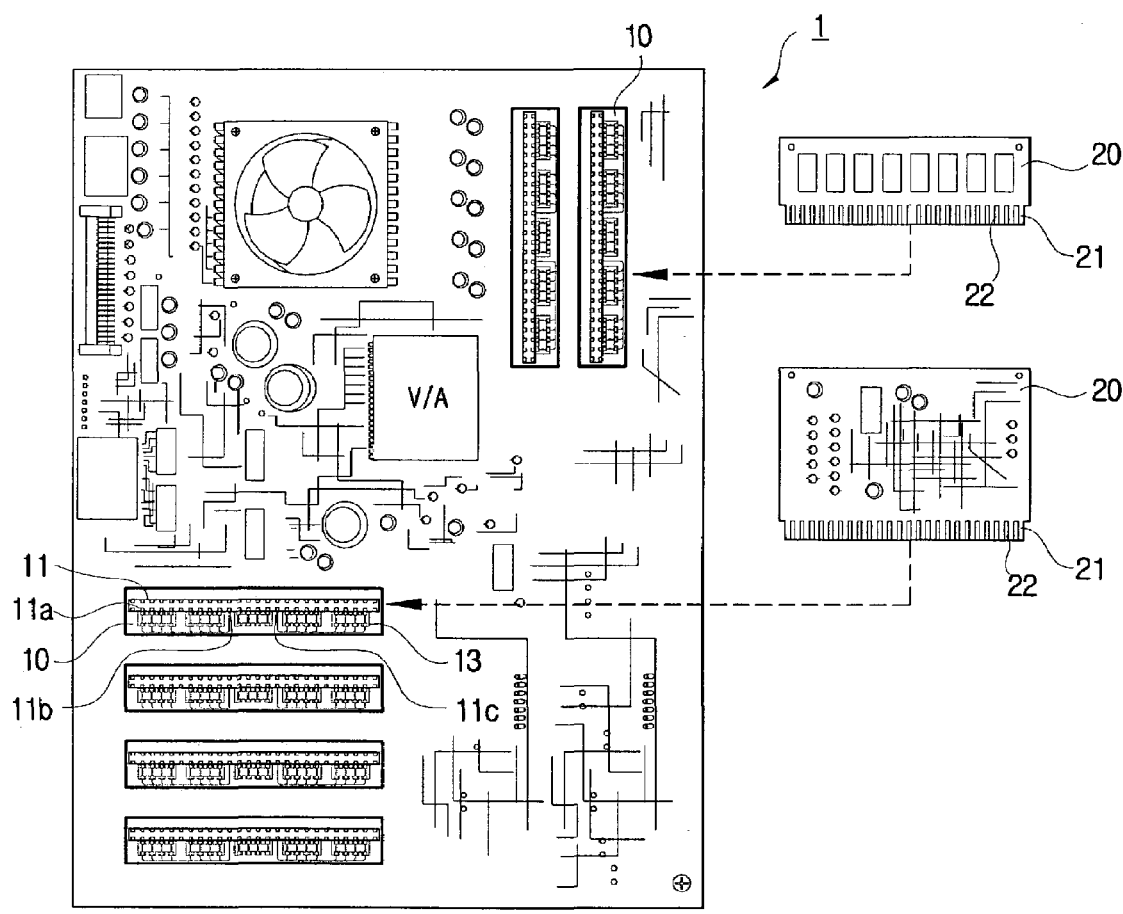
FIG. 1 is a plan view of a main board according to an embodiment of the present invention.

Reference will now be made in detail to the embodiments of the present invention, examples of which are illustrated in the accompanying drawings, wherein like reference numerals refer to like elements throughout. The embodiments are described below in order to explain the present invention by referring to the figures.

FIG. 1 is a plan view of a main board with card slots 10 according to an embodiment of the present invention. As shown, each card slot 10 is fabricated on a main board 1. The card slots 10 are made of plastic material and shaped like a rectangular stick. The card slot 10 comprises a top opening slot 11 into which signal input/output terminals 21 of various cards 20 such as a memory card, a video card, etc., are inserted.

The slot 11 is provided with a plurality of data transmission pins 11a corresponding to a plurality of signal input/output pins 22 formed on the signal input/output terminal 21, and a power pin 11b and a ground pin 11c through which electric power is supplied. The data transmission pins 11a of the card slot 10 are connected to a CPU 30 (refer to FIGS. 4A–4D) through a bus 40 (refer to FIGS. 4A–4D).

When the card 20 is inserted into the card slot 10, the signal input/output pins 22 are in contact with the data transmission pins 11a, thereby allowing data transmission between the main board 1 and the card 20.

Figure 2:
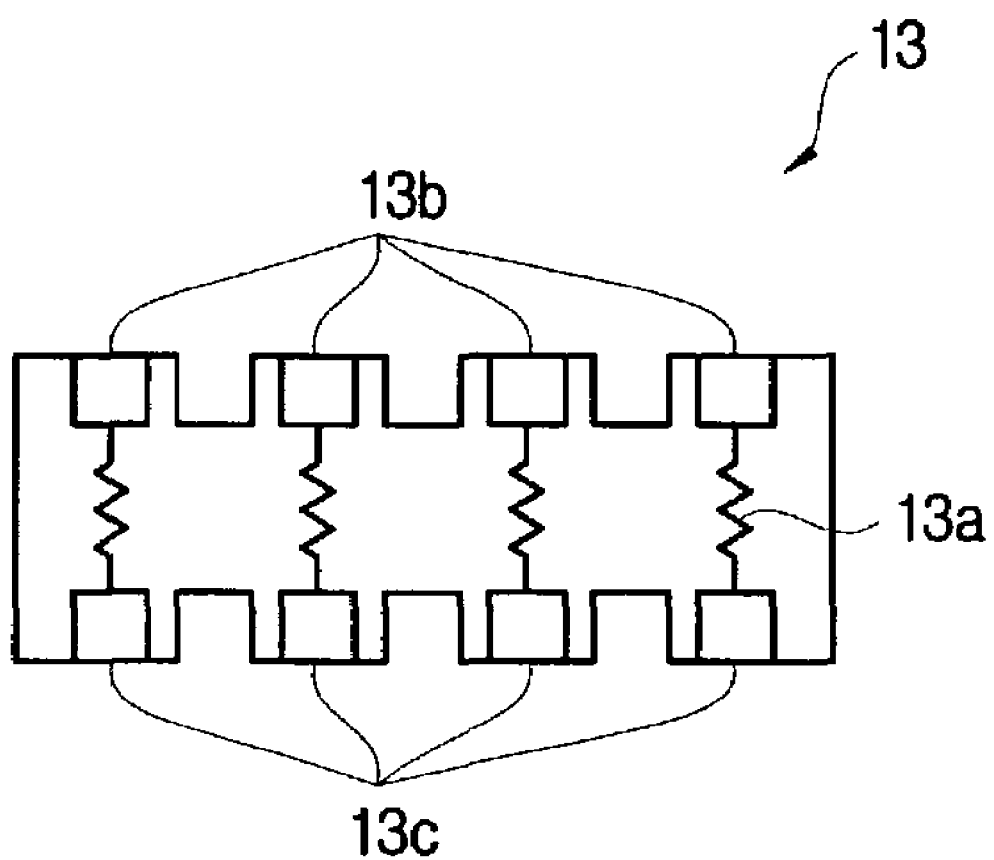
FIG. 2 illustrates a configuration of a chip resistor inside a card slot according to the present invention.

FIG. 2 illustrates a configuration of a chip resistor 13 internally provided in the card slot 10. The card slot 10 is internally provided with a termination for impedance matching, the termination comprising the chip resistor 13. As shown in FIG. 2, the chip resistor 13 is shaped like a rectangular plate, and includes a plurality of resistors 13a and a plurality of first and second terminals 13b and 13c connected to the resistors 13a. The first terminals 13b of the chip resistor 13 are connected to the data transmission pins 11a, respectively. The second terminals 13c of the chip resistor 13 are connected to the power pin 11b or the ground pin 11c of the card slot 10.

Figure 3:
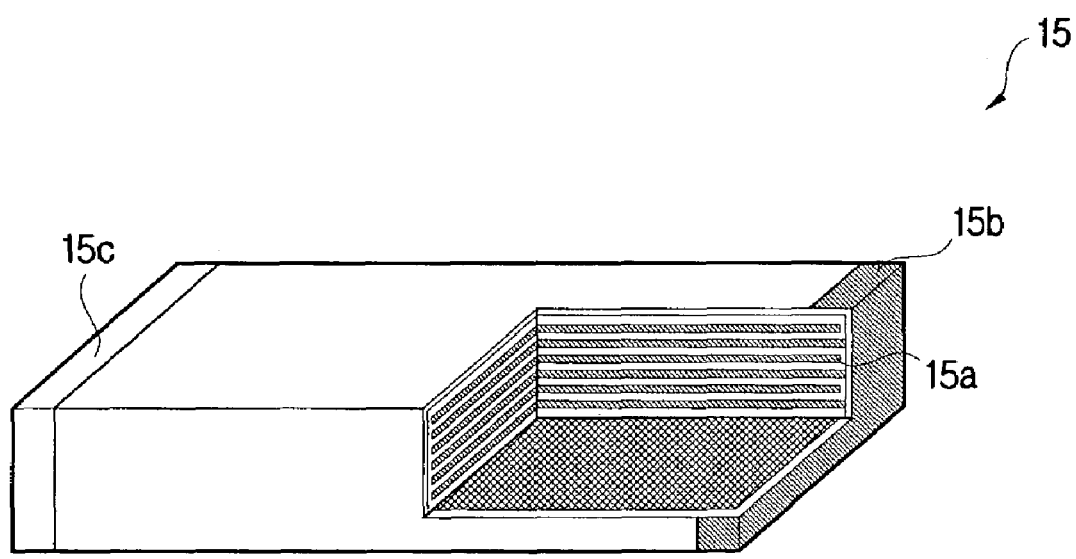
FIG. 3 illustrates a configuration of a chip capacitor inside the card slot according to the present invention.
Figure 4A:
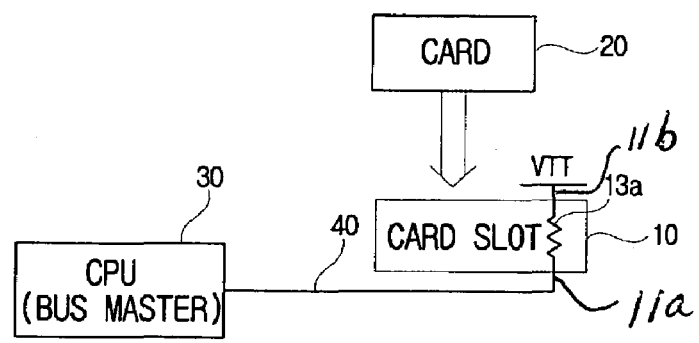
FIGS. 4A through 4D illustrate connections between a termination and the card slot according to the present invention.
Figure 4B:
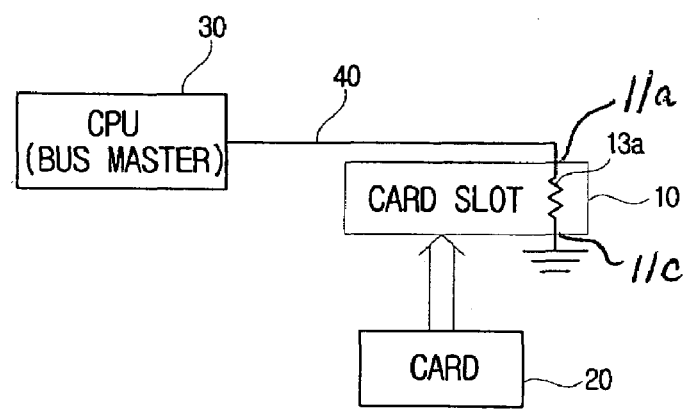
Figure 4C:
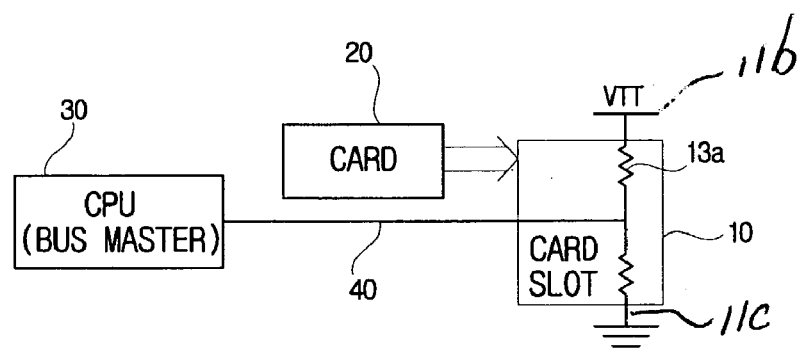
Figure 4D:
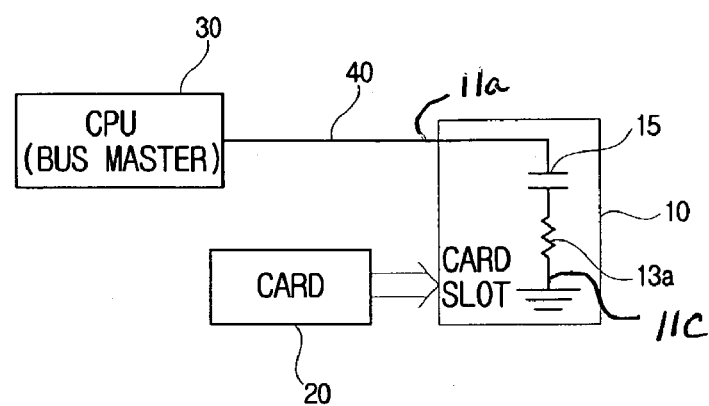
Figure 5:
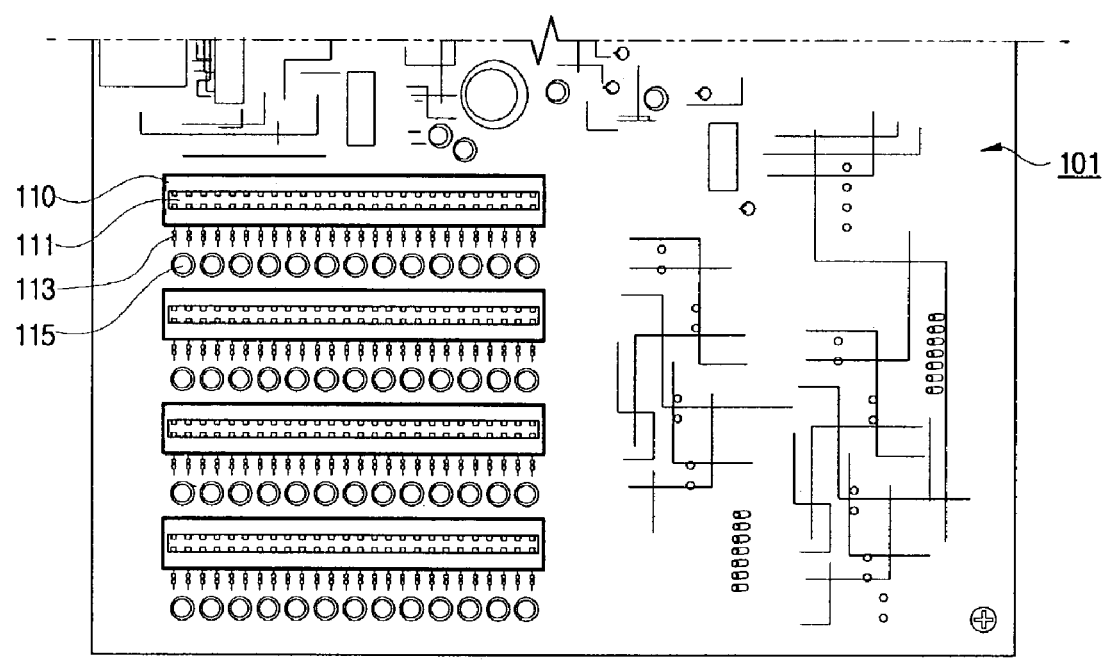
FIG. 5 is a plan view of a conventional main board.
Figure 6A:
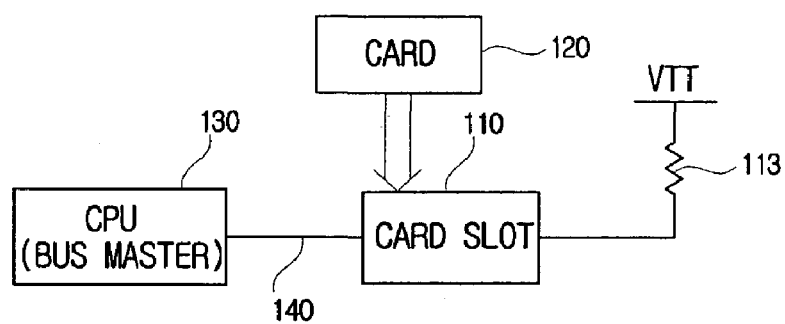
FIGS. 6A through 6D illustrate connections between a termination and a card slot in the conventional main board.
Figure 6B:
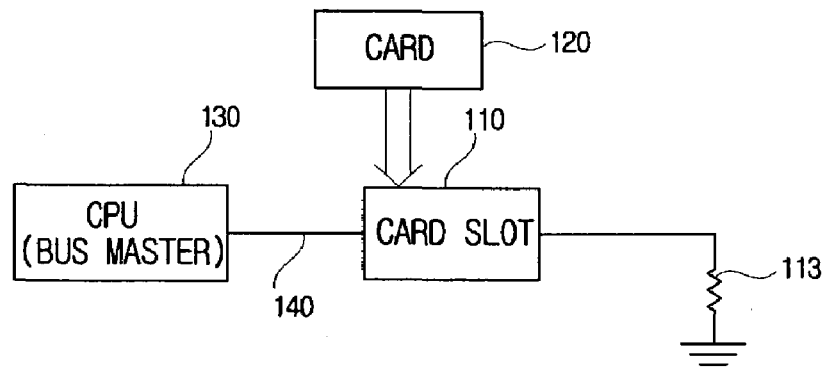
Figure 6C:
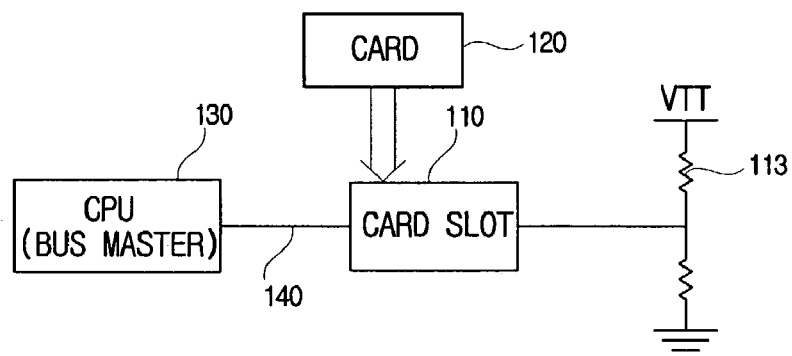
Figure 6D:
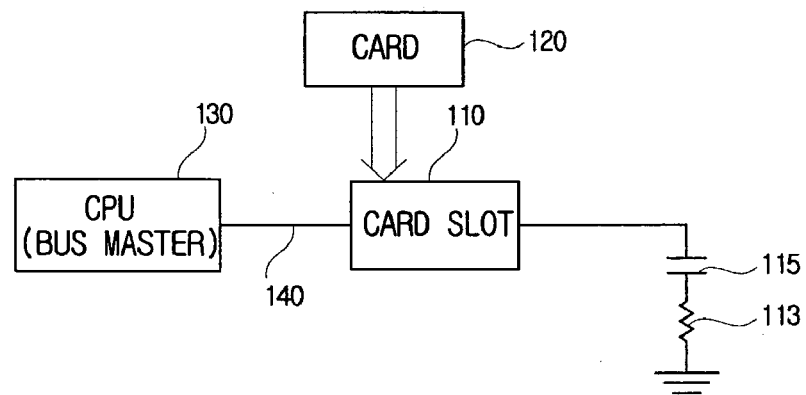

In another implementation, the termination may comprise a chip capacitor 15 and the chip resistor 13. As shown in FIG. 3, the chip capacitor 15 is shaped like a rectangular solid partially coated with ceramic material, and includes a plurality of internal electrodes 15a made of conductive material (Pd or Ni) thereinside and first and second external electrodes 15b and 15c made of copper material at opposite ends thereof. The first and second external electrodes 15b and 15c may be connected to one of the data transmission pins 11a and the ground pin 11c, respectively.

FIGS. 4A through 4D illustrate connections between the termination and the card slot according to the present invention. The resistor 13a is connected between one of the data transmission pins 11a and the power pin (VTT) 11b of the card slot 10 (refer to FIG. 4A). The resistor 13a also may be connected between one of the data transmission pins 11a and the ground pin 11c of the card slot 10 (refer to FIG. 4B). In the implementation in FIG. 4C, one of the data transmission pins 11a of the card slot 10 is connected between the first resistor 13a connected to the power pin (VTT) 11b and the second resistor 13a connected to the ground pin 11c. In a further implementation, the resistor 13a and the capacitor chip 15 are connected between one of the data transmission pins 11a and the ground pin 11c in series (refer to FIG. 4D).

In the foregoing embodiments, the present invention is applied to the card slot of the main board. However, the present invention may be applied to a PCB having a card slot and an electric circuit of an electric device. With this configuration, a card slot, through which a card is connected to a main board, internally comprises a plurality of resistors and capacitors for impedance matching, so that space on the PCB can be efficiently utilized.

As described above, the present invention provides a PCB having a card slot internally comprising an electronic device to do impedance matching, so that the space of the PCB can be efficiently utilized. The PCB may be an expansion board or an add-in board that provides extended or additional capability. The present invention may be also be implemented in other embodiments. For example, the card slot may be configured to accept another type of device, such as, an "add-in," which can be an individual chip. In another implementation, the card slot may be configured to accept a removable cartridge, such as, for example, a hard disk enclosed in a plastic or metal cartridge.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A PCB comprising:
    a card slot for receiving a card provided with input/output pins to provide extended capability, the card slot comprising:
        data transmission pins,
        a power pin,
        a ground pin, and
        an electronic device formed internal to the card slot for providing impedance matching with the card, the electronic device connected between one of the data transmission pins and at least one of the power pin and the ground pin; and
    circuit paths which connect at least some of the input/output pins with external circuitry.

2. The PCB according to claim 1, wherein the electronic device includes at least one of a chip capacitor and a chip resistor.

3. The PCB according to claim 2, wherein the electronic device comprises one chip resistor connected between the one of the data transmission pins and one of the power pin and the ground pin.

4. The PCB according to claim 2, wherein the electronic device comprises one chip capacitor connected between one of the data transmission pins and one of the power pin and the ground pin.

5. The PCB according to claim 2, wherein the electronic device comprises the chip capacitor and the chip resistor serially connected between the one of the data transmission pins and one of the power pin and the ground pin.

6. A card slot for receiving a card provided with signal input/output pins to provide extended capability, the card slot comprising:
    data transmission pins,
    a power pin,
    a ground pin in correspondence to the signal input/output pins, and
    an electronic device formed internally with the slot to provide impedance matching with the card, the electronic device having a first end connected to at least one of the data transmission pins and a second end connected to one of the power pin and the ground pin.

7. A hardware interface for receiving a device providing operability to a computer, the hardware interface comprising:
    a slot providing an electrical and mechanical connection with the device, the slot comprising an internal circuit element which reduces an impedance loss between the hardware interface and other components of the computer, wherein the circuit element comprises:
a chip capacitor having a rectangular shape,
a partial coating of a ceramic material,
a plurality of internal electrodes made of a conductive material, and
a first external electrode and a second external electrode made of a copper material at opposing ends of the rectangular shape.

8. The hardware interface of claim 7, wherein the conductive material of the internal electrodes comprises palladium or nickel.

9. A hardware interface for receiving a device providing operability to a computer, the hardware interface comprising:
a slot providing an electrical and mechanical connection with the device, the slot comprising an internal circuit element which reduces an impedance loss between the hardware interface and other components of the computer;
a data transmission pin connected to a first external electrode; and
a ground pin connected to a second external electrode.

10. A hardware interface for receiving a device providing operability to a computer, the hardware interface comprising:
a slot providing an electrical and mechanical connection with the device, the slot comprising an internal circuit element which reduces an impedance loss between the hardware interface and other components of the computer; and
a plurality of first terminals and second terminals,
wherein the circuit element comprises a plurality of resistors connected between the first terminals and the second terminals.

11. The hardware interface of claim 10, wherein each of the resistors is shaped as a rectangular plate.

12. The hardware interface of claim 10, further comprising a power pin connected to the first terminals and a ground pin connected to the second terminals.

* * * * *

UNITED STATES PATENT AND TRADEMARK OFFICE
CERTIFICATE OF CORRECTION

PATENT NO. : 7,027,308 B2 Page 1 of 1
APPLICATION NO. : 10/444989
DATED : April 11, 2006
INVENTOR(S) : Jin-kwon Park et al.

It is certified that error appears in the above-identified patent and that said Letters Patent is hereby corrected as shown below:

On the title page item (75), change "Jin-Kwon" to --Jin-kwon--.

Signed and Sealed this

Twenty-first Day of November, 2006

JON W. DUDAS
*Director of the United States Patent and Trademark Office*